United States Patent
Choung et al.

(10) Patent No.: US 11,552,143 B1
(45) Date of Patent: Jan. 10, 2023

(54) OLED PANEL WITH TRENCH OVERHANG STRUCTURES

(71) Applicant: Applied Materials, Inc., Santa Clara, CA (US)

(72) Inventors: Ji-young Choung, Hwaseong-si (KR); Jungmin Lee, Santa Clara, CA (US); Chung-Chia Chen, Hsinchu (TW); Yusin Lin, Zhubei (TW); Dieter Haas, San Jose, CA (US); Si Kyoung Kim, Gwangju-si (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/661,320

(22) Filed: Apr. 29, 2022

(51) Int. Cl.
*H01L 27/32* (2006.01)
*H01L 51/52* (2006.01)

(52) U.S. Cl.
CPC ...... *H01L 27/3246* (2013.01); *H01L 27/3283* (2013.01); *H01L 51/5225* (2013.01)

(58) Field of Classification Search
None
See application file for complete search history.

(56) References Cited

U.S. PATENT DOCUMENTS

| 11,348,983 | B1* | 5/2022 | Choung | H01L 51/0008 |
| 2012/0217516 | A1* | 8/2012 | Hatano | H01L 51/525 |
| | | | | 257/E33.062 |
| 2021/0200357 | A1* | 7/2021 | Lee | H01L 51/56 |
| 2022/0102448 | A1* | 3/2022 | Liu | H01L 51/5284 |

* cited by examiner

*Primary Examiner* — Michelle Mandala
(74) *Attorney, Agent, or Firm* — Patterson & Sheridan, LLP

(57) ABSTRACT

Embodiments described herein generally relate to sub-pixel circuits that may be utilized in a display such as an organic light-emitting diode (OLED) display. The device includes substrate, pixel-defining layer (PDL) structures disposed over the section of the substrate, inorganic or metal overhang structures disposed on an upper surface of the PDL structures, and a plurality of sub-pixels. The PDL structures include a trench disposed in the top surface of the PDL structure. Each sub-pixel includes an anode, an OLED material disposed over and in contact with the anode, and a cathode disposed over the OLED material. The inorganic or metal overhang structures have an overhang extension that extends laterally over the trench. An encapsulation layer is disposed over the cathode and extends under at least a portion of the inorganic or metal overhang structures and along a top surface of the PDL structures.

30 Claims, 6 Drawing Sheets

OLED PANEL WITH TRENCH OVERHANG STRUCTURES

BACKGROUND

Field

Embodiments described herein generally relate to a display. More specifically, embodiments described herein relate to sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semitransparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits that can increase the pixels-per-inch and provide improved OLED performance.

SUMMARY

In one embodiment, a device having a plurality of sub-pixels is provided. Each sub-pixel includes a section of a substrate, a first and second pixel-defining layer (PDL) including a non-conductive material disposed over the section of the substrate, each of the first and second PDL structures having a trench disposed between peripheral portions of an upper surface of each of the first and second PDL structures. Each sub-pixel further includes a first and second inorganic overhangs, each of the first and second inorganic overhangs defined by an overhang extension of an inorganic layer and disposed on a set of sidewalls and peripheral portions of the upper surface of the first and second PDL structures. The overhang extension extends laterally over the trench to define the first and second PDL overhangs. Each sub-pixel further includes an anode, an organic light-emitting diode (OLED) material disposed on the anode and the inorganic layer, and a cathode disposed over the OLED material. The cathode, OLED material disposed on the inorganic layer, and the inorganic layer disposed on the peripheral portions of the upper surface of the first and second PDL structures extends past peripheral portions of the upper surface of the first and second PDL layer and defines the overhang extension. An encapsulation layer is disposed over each sub-pixel and the encapsulation layer is in contact with the cathode, sidewalls of the cathode, the OLED material, and the inorganic layer, an underside surface of each overhang extension of the inorganic layer, and a portion of a top surface of the trench disposed between peripheral portions of each of the first and second PDL structures.

In another embodiment, a device having a plurality of sub-pixels is provided. Each sub-pixel includes a section of a substrate, a first and second PDL including a non-conductive material disposed over the section of the substrate, each of the first and second PDL structures having a trench disposed between peripheral portions of an upper surface of each of the first and second PDL structures. Each sub-pixel further includes a first and second metal overhangs, each of the first and second metal overhangs defined by an overhang extension of a metal layer and disposed on the peripheral portions of the upper surface of the first and second PDL structures. The overhang extension extends laterally over the trench to define the first and second metal overhangs. Each sub-pixel further includes an inorganic layer disposed on sidewalls of the first and second PDL structures and over the metal layer disposed on the peripheral portions of the uppers surface of the first and second PDL structures. Each sub-pixel further includes an anode, an OLED material disposed on the anode and the inorganic layer disposed on the sidewalls, the peripheral portions of the upper surface, and the overhang extension of the first and second PDL structures, and a cathode disposed on the OLED material. The cathode disposed on the OLED material is disposed over the anode, the inorganic layer disposed on sidewalls of the first and second PDL structures and over the metal layer disposed on the peripheral portions of the upper surface of the first and second PDL structures, and the overhang extension of the metal layer. The cathode extends to contact exterior sidewalls of the OLED material, the inorganic layer, and the overhang extension of the metal layer. An encapsulation layer is disposed over each sub-pixel and the encapsulation layer is in contact with the cathode, sidewalls of the cathode, the OLED material, the inorganic layer, and the overhang extension of the metal layer, an underside surface of each overhang extension of the metal layer, and a portion of a top surface of the trench disposed between peripheral portions of each of the first and second PDL structures.

In another embodiment, a device having a plurality of sub-pixels is provided. Each sub-pixel includes a section of a substrate, a first and second PDL including an inorganic material disposed over the section of the substrate, each of the first and second PDL structures having a trench disposed between peripheral portions of an upper surface of each of the first and second PDL structures. Each sub-pixel further includes a first and second metal overhangs, each of the first and second metal overhangs defined by an overhang extension of a metal layer and disposed on the peripheral portions of the upper surface of the first and second PDL structures. The overhang extension extends laterally over the trench to define the first and second metal overhangs. Each sub-pixel further includes an anode, an OLED material disposed on the anode, sidewalls of the first and second PDL structures, the metal layer disposed on the peripheral portions of the upper surface, and the overhang extension of the first and second PDL structures. Each sub-pixel further includes a cathode disposed on the OLED material. The cathode disposed on the OLED material is disposed over the anode, the sidewalls of the first and second PDL structures, the metal layer disposed on the peripheral portions of the upper surface of the first and second PDL structures, and the overhang extension of the metal layer. The cathode extends to contact exterior sidewalls of the OLED material and the overhang extension of the metal layer. An encapsulation layer is disposed over each sub-pixel and the encapsulation layer is in contact with the cathode, sidewalls of the cathode, the OLED material, and the overhang extension of the metal layer, an underside surface of each overhang extension of the metal layer, and a portion of a top surface of the trench disposed between peripheral portions of each of the first and second PDL structures.

In yet another embodiment, a device having a plurality of sub-pixels is provided. Each sub-pixel includes a section of a substrate, a first and second PDL including an inorganic material disposed over the section of the substrate, each of the first and second PDL structures having a trench disposed between peripheral portions of an upper surface of each of the first and second PDL structures. Each sub-pixel further includes a first and second metal overhangs, each of the first and second metal overhangs defined by an overhang extension of a metal layer, the metal layer having the overhang extension and an interior portion disposed on the peripheral portions of the upper surface of the first and second PDL structures. The overhang extension having a first tapered sidewall and the interior portion having a second tapered sidewall. The overhang extension extends laterally over the trench to define the first and second metal overhangs. Each sub-pixel further includes an anode, an OLED material disposed on the anode, sidewalls of the first and second PDL structures, the second tapered sidewall of the interior portion, and a top surface of the metal layer. Each sub-pixel further includes a cathode disposed on the OLED material. The cathode disposed on the OLED material is disposed over the anode, the sidewalls of the first and second PDL structures, the metal layer disposed on the peripheral portions of the upper surface of the first and second PDL structures, and the overhang extension of the metal layer. The cathode contacts the second tapered sidewall of the interior portion of the metal layer. An encapsulation layer is disposed over each sub-pixel and the encapsulation layer is in contact with the cathode, sidewalls of the cathode, the OLED material, and the overhang extension of the metal layer, an underside surface of each overhang extension of the metal layer, and a portion of a top surface of the trench disposed between peripheral portions of each of the first and second PDL structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a display. More specifically, embodiments described herein relate to sub-pixel circuits that may be utilized in a display such as an OLED display. In one embodiment, which can be combined with other embodiments described herein, the display is a bottom emission (BE) or a top emission (TE) OLED display. In another embodiment, which can be combined with other embodiments described herein, the display is a passive-matrix (PM) or an active matrix (AM) OLED display.

A first sub-pixel circuit has a line-type architecture. The first sub-pixel circuit includes adjacent non-conductive PDL structures having a trench disposed therein. Inorganic overhangs are disposed over the non-conductive PDL structures, and a cathode that contacts a common cathode of the OLED display. A second sub-pixel circuit, a third sub-pixel circuit, and a fourth sub-pixel circuit having a line-type or dot-type architecture. The second sub-pixel circuit includes adjacent non-conductive PDL structures having a trench disposed therein. Metal overhangs are disposed over the adjacent non-conductive PDL structures with an inorganic layer disposed thereover. A cathode that makes contacts exterior sidewalls of the OLED material, the inorganic layer, and the overhang extension of the metal layer of the metal overhangs. The third sub-pixel circuit includes adjacent inorganic PDL structures having a trench disposed therein. The third sub-pixel circuit further includes metal overhangs that are disposed over the adjacent inorganic PDL structures and a cathode that contacts the sidewalls of the metal overhangs. A fourth sub-pixel circuit includes adjacent inorganic PDL structures having a trench disposed therein. The fourth sub-pixel circuit further includes metal overhangs and a cathode that contacts an interior tapered sidewall of the metal overhangs.

While the Figures depict two sub-pixels, the sub-pixel circuit of the embodiments described herein include a plurality of sub-pixels, such as two or more sub-pixels. Each sub-pixel has the OLED material configured to emit a white, red, green, blue or other color light when energized. For example, the OLED material of a first sub-pixel emits a red light when energized, the OLED material of a second sub-pixel emits a green light when energized, and the OLED material of a third sub-pixel emits a blue light when energized.

Figure 1A:
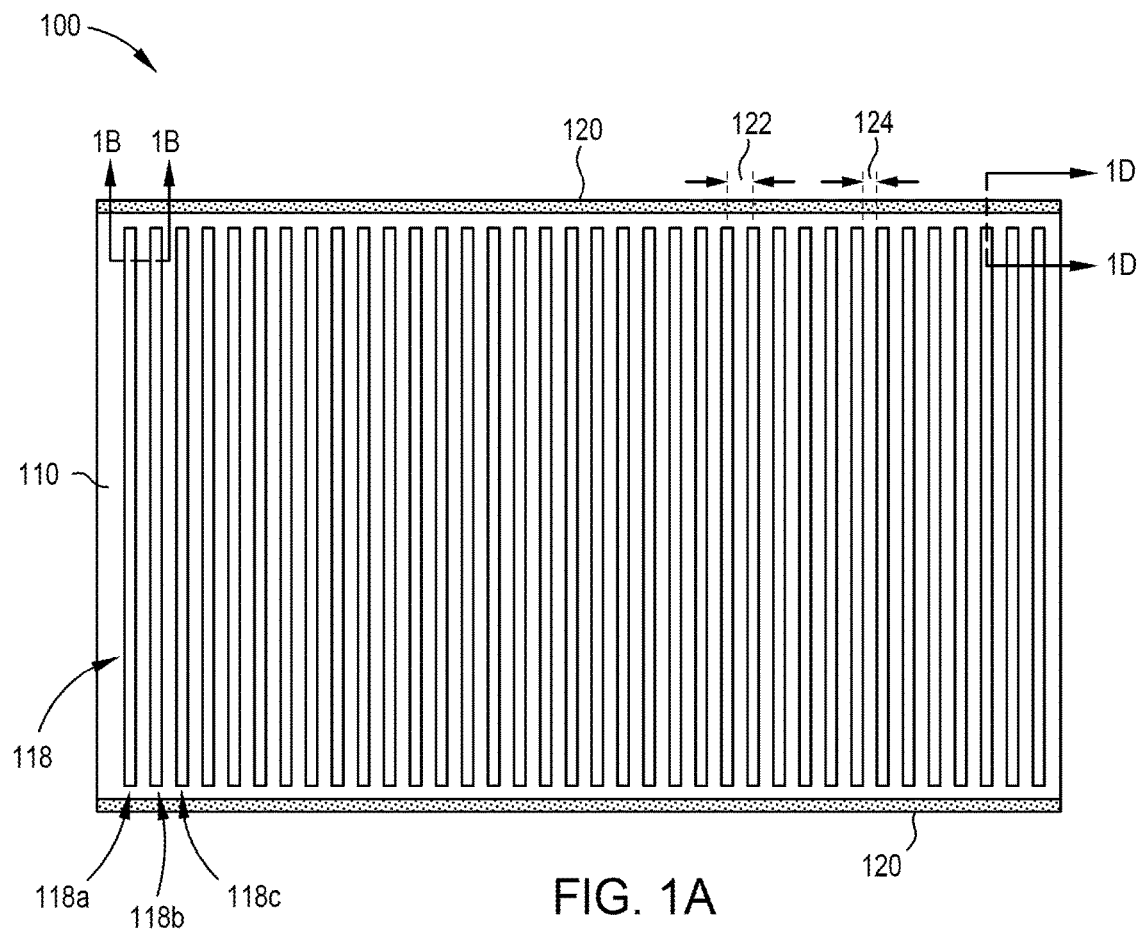
FIG. 1A is a schematic, top-view of a first sub-pixel circuit according to embodiments described herein.
Figure 1B:
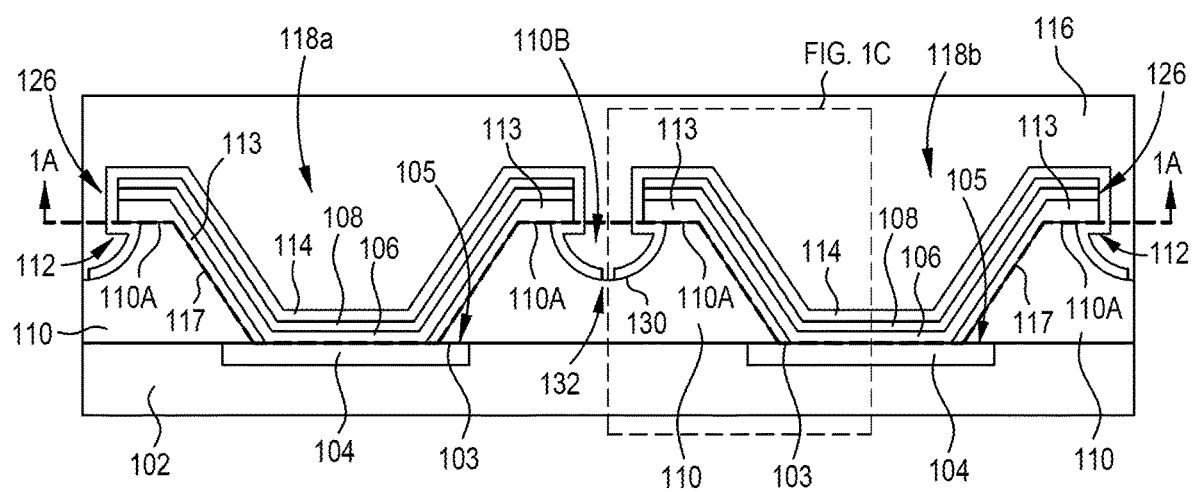
FIGS. 1B and 1D are schematic, cross-sectional view of a first sub-pixel circuit according to embodiments described herein.

FIG. 1A is a schematic, top-view of a first sub-pixel circuit 100. FIG. 1B is a cross-sectional view of a first sub-pixel circuit. While FIG. 1B depicts the first sub-pixel 118a and the second sub-pixel 118b, the first sub-pixel circuit 100 of the embodiments described herein may include two or more sub-pixels 118, such as a third sub-pixel 118c and a fourth sub-pixel.

The first sub-pixel circuit 100 has a line-type architecture 101D. The first sub-pixel circuit 100 includes a plurality of sub-pixels 118 including at least a first sub-pixel 118a, a second sub-pixel 118b, and a third sub-pixel 118c. Each sub-pixel 118 has an OLED material 106 configured to emit a white, red, green, blue or other color light when energized. For example, the OLED material 106 of the first sub-pixel 118a may emit a red light, the OLED material of the second sub-pixel 118b may emit a green light, and the OLED material of the third sub-pixel 118c may emit a blue light when energized. Adjacent non-conductive PDL structures 110 define each sub-pixel 118. The first sub-pixel circuit 100 has a density of at least 2,000 pixels-per-inch (ppi). The plurality of sub-pixels 118 are spaced from each other by a pitch 122. In some embodiments, the non-conductive PDL structures 110 have a width 124 that is substantially the same. The width 124 of the adjacent non-conductive PDL structures 110 is about 2 to about 6 microns and the pitch 122 between each sub-pixel 118 is less than 13 microns.

The line-type architecture 101D of the first sub-pixel circuit 100 further includes common cathodes 120. In one embodiment, which can be combined with other embodiments described herein, the common cathodes 120 are electrically connected to one or more bus bars (not shown), which provides electrical current and/or voltage to the common cathodes 120. Each sub-pixel 118 includes a first end of a cathode 108 (as shown in FIG. 1D) that contacts one of the common cathodes 120 and a second end of the cathode 108 that contacts another of the common cathodes 120. I.e., each sub-pixel 118 is in global contact with a common cathode 120 via the cathode 108 of each sub-pixel. The common cathodes 120 are positioned above and below each of the plurality of sub-pixels 118 in order to provide a conductive path for electrical current to flow from the common cathodes 120 to each sub-pixel 118.

Figure 1C:
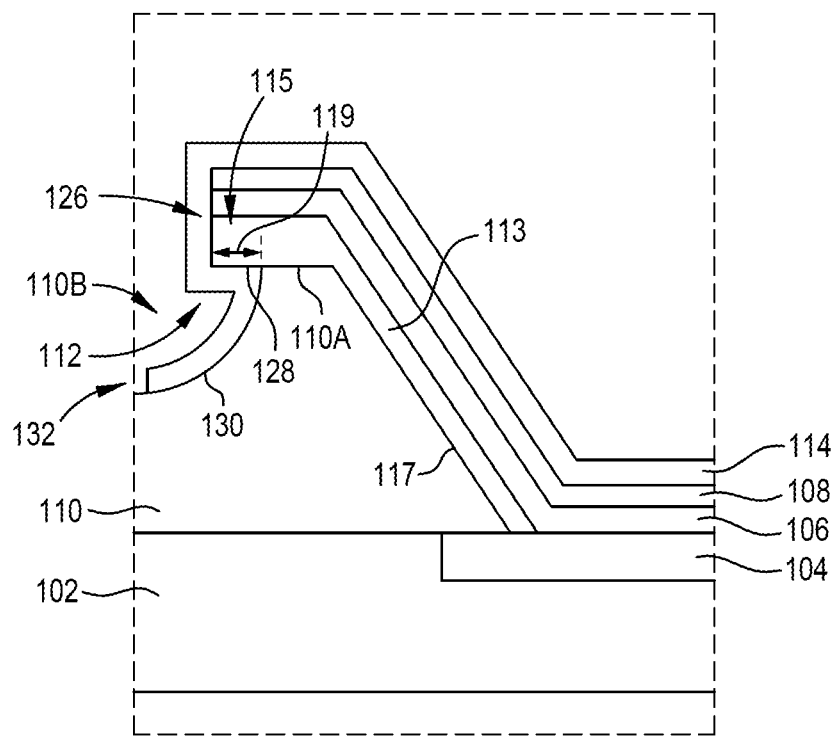
FIG. 1C is a schematic, cross-sectional view of an inorganic overhang of a first sub-pixel circuit according to embodiments described herein.
Figure 1D:
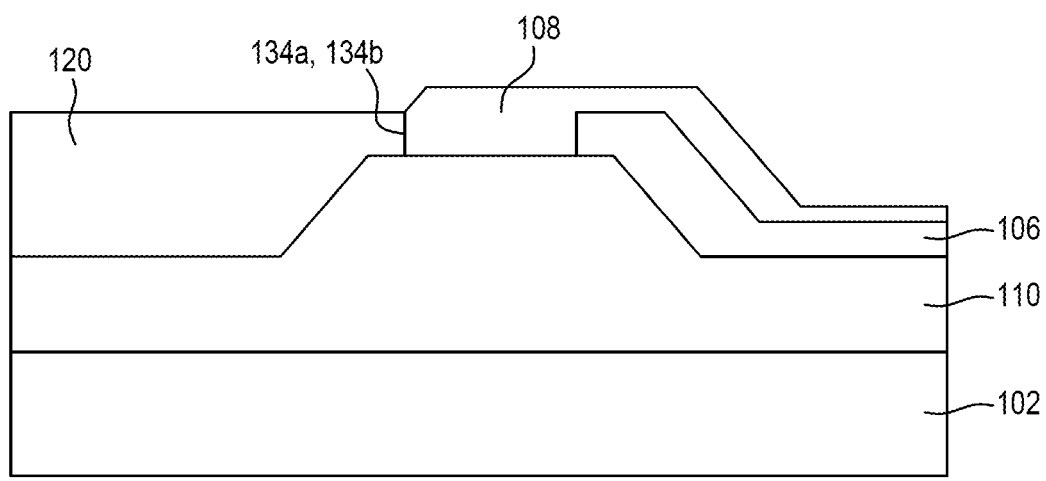

FIG. 1C is a schematic, cross-sectional view of an inorganic overhang 112 of a first sub-pixel circuit 100. The first sub-pixel circuit 100 includes a substrate 102. Anodes 104 are disposed on a top surface 103 of the substrate 102. In one embodiment, which can be combined other embodiments described herein, the anodes 104 are pre-patterned on the substrate 102. For example, the substrate 102 is a pre-patterned indium tin oxide (ITO) glass substrate. The anodes 104 include, but are not limited to, chromium, titanium, gold, silver, copper, aluminum, ITO, a combination thereof, or other suitably conductive materials.

Non-conductive PDL structures 110 are disposed on the substrate 102 and peripheral portions 105 of the anodes 104. The non-conductive material of the non-conductive PDL structures 110 includes one of an organic material or an inorganic material. The organic material of the non-conductive PDL structures 110 includes, but is not limited to, polyimides. The inorganic material of the non-conductive PDL structures 110, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent non-conductive PDL structures 110 define a respective sub-pixel 118 and expose the anode 104 of the respective sub-pixel 118 of the first sub-pixel circuit 100. Each non-conductive PDL structure 110 on the first sub-pixel circuit 100 has a trench 110B disposed between peripheral portions 110A of an upper surface of each non-conductive PDL structure 110. The trench 110B of each non-conductive PDL structure 110 is formed by an isotropic dry etching process after photoresist patterning each non-conductive PDL structure 110.

Inorganic layers 113 are disposed on the adjacent non-conductive PDL structures 110 of each sub-pixel 118. In one embodiment, the inorganic layers 113 are disposed on portions of an anode 104 and the adjacent non-conductive PDL structures 110. The inorganic layers 113 of a sub-pixel 118 are permanent to the sub-pixel circuit and further define each sub-pixel 118 of the first sub-pixel circuit 100. The inorganic layers 113 includes an inorganic material. The inorganic material includes, but is not limited to, an inorganic silicon-containing material. For example, the silicon-containing material includes oxides or nitrides of silicon, or combinations thereof, such as silicon oxide ($SiO_2$), silicon nitride ($Si_3N_4$), or silicon oxynitride ($Si_2N_2O$). Inorganic overhangs 112 are defined by an overhang extension 115 of an inorganic layer 113 disposed on sidewalls 117 and peripheral portions 110A of the upper surface of non-conductive PDL structures 110. The overhang extension 115 of each inorganic overhang 112 extends laterally past the peripheral portions 110A of the upper surface of a non-conductive PDL structure 110 and hangs over the trench 110B of a non-conductive PDL structure 110. The width 119 of the overhang extension is about 0.5 µm to about 1.5 µm. The first sub-pixel 118 utilizes the trench 110B disposed in the non-conductive PDL structures 110 and the overhang extension 115 extending over the trench 110B to define the overhang. Since the trench 110B is disposed in the non-conductive PDL structures 110, additional layers disposed on the inorganic PDL structures 110 are not required. Reducing the need for additional layers to define the overhang reduces process costs and design parameters to define the overhang results in increased throughput.

An OLED material 106 is disposed on the anode 104 and the inorganic layers 113 of each sub-pixel 118. A cathode 108 is disposed on the OLED material 106 that is disposed over the anode 104, the inorganic layer 113 disposed on sidewalls 117 and the peripheral portions 110A of the non-conductive PDL structures 110, and the overhang extension 115 of the inorganic layer 113. In some embodiments, directional evaporation deposition is used for the deposition of the OLED material 106 and the cathode 108. The directional evaporation deposition of the OLED material 106 and thereafter the cathode 108 is performed at determined deposition angles that prevents the OLED material 106 and the cathode 108 from being disposed underneath the overhang extension 115 of each inorganic overhang 112 and inside the trench 110B.

Each sub-pixel 118 includes an encapsulation layer 114. The encapsulation layer 114 may be or may correspond to a local passivation layer. The encapsulation layer 114 of a respective sub-pixel 118 is disposed over the cathode 108. The encapsulation layer 114 is in contact with the sidewalls 126 of the cathode 108, the OLED material 106, and the inorganic layer 113. The encapsulation layer 114 extends under at least a portion of each underside surface 128 of the overhang extension 115. In some embodiments, which can be combined with other embodiments described herein, the encapsulation layer 114 is disposed over the top surface 130 of the non-conductive PDL structures 110. In some embodiments, which can be combined with other embodiments described herein, there exists a gap 132 between the encapsulation layer 114 disposed on one inorganic overhang 112 and the encapsulation layer 114 disposed on the adjacent inorganic overhang 112. The encapsulation layer 114 includes an inorganic material, such as a silicon-containing material. The silicon-containing material may include $Si_3N_4$ containing materials. In some embodiments, which can be combined with other embodiments described herein, each sub-pixel 118 includes a global encapsulation layer 116. The global encapsulation layer 116 is disposed over the encapsulation layer 114. An inkjet layer may be disposed between the global encapsulation layer 116 and the encapsulation layer 114. The inkjet layer may include an acrylic material. In some embodiments, which can be combined with other embodiments described herein, the encapsulation layer 114 and the global encapsulation layer 116 are deposited using isotropic deposition processes. The isotropic deposition process deposits the encapsulation layer 114 such that the encapsulation layer 114 makes contact with the underside surface 128 of the overhang extension 115 and the top surface of 130 of the non-conductive PDL structures 110. The isotropic deposition process deposits the global encapsulation layer 116 to be disposed over at least the encapsulation layer 114 in the trench 1106.

FIG. 1D is a schematic, cross-sectional view of a first sub-pixel circuit 100. As shown in FIG. 1D, the first sub-pixel circuit 100 is in global contact with common cathodes 120. A first sub-pixel circuit 100 with a line-type architecture 101D includes common cathodes 120 that extends along the width of the first sub-pixel circuit 100, above and below each of the plurality of sub-pixels 118. The common cathodes 120 are disposed on the non-conductive PDL structure 110. Each sub-pixel 118 of the plurality of sub-pixels 118 on the first sub-pixel circuit 100 includes a first end 134a of a cathode 108 that contacts one of the common cathodes 120, and a second end 134b of the cathode 108 that contacts another of the common cathodes 120. In one embodiment, which can be combined with other embodiments described herein, the common cathodes 120 are electrically connected to one or more bus bars (not shown), which provides electrical current and/or voltage to the common cathodes 120. The common cathodes 120 are positioned above and below each of the plurality of sub-pixels 118 in order to provide a conductive path for electrical current to flow from the common cathodes 120 to each sub-pixel 118.

Figure 2A:
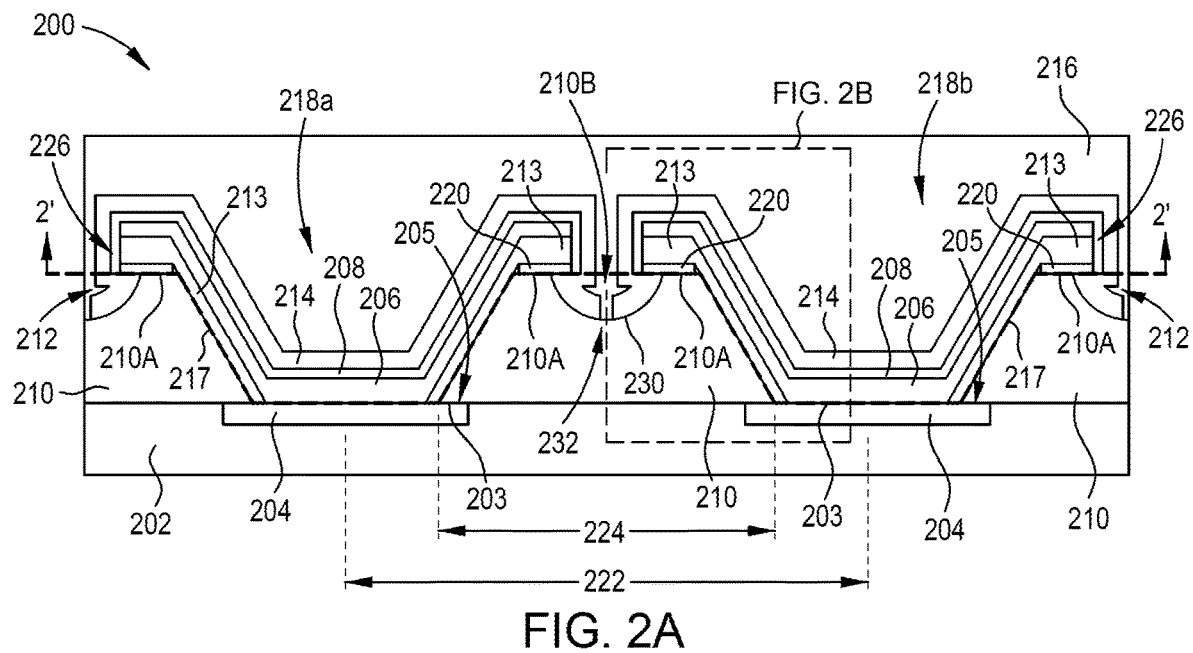
FIG. 2A is a schematic, cross-sectional view of a second sub-pixel circuit according to embodiments described herein.

FIG. 2A is a schematic, cross-sectional view of a second sub-pixel circuit 200 having metal overhangs 212 with a cathode 208 that extends to contact exterior sidewalls 226 of a OLED material 206, an inorganic layer 213, and an overhang extension 215 of a metal layer 220. While FIG. 2A depicts the first sub-pixel 218a and the second sub-pixel 218b, the second sub-pixel circuit 200 of the embodiments described herein may include two or more sub-pixels 218, such as a third and a fourth sub-pixel.

Figure 2B:
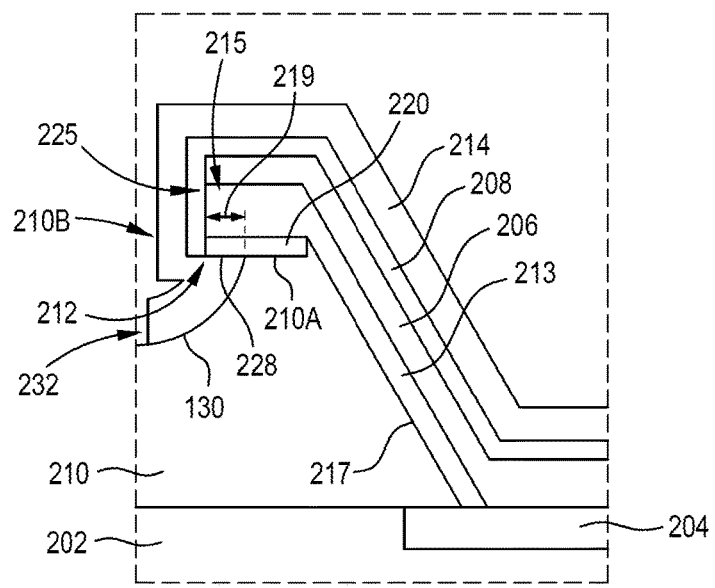
FIG. 2B is a schematic, cross-sectional view of a metal overhang of a second sub-pixel circuit according to embodiments described herein.
Figure 2C:
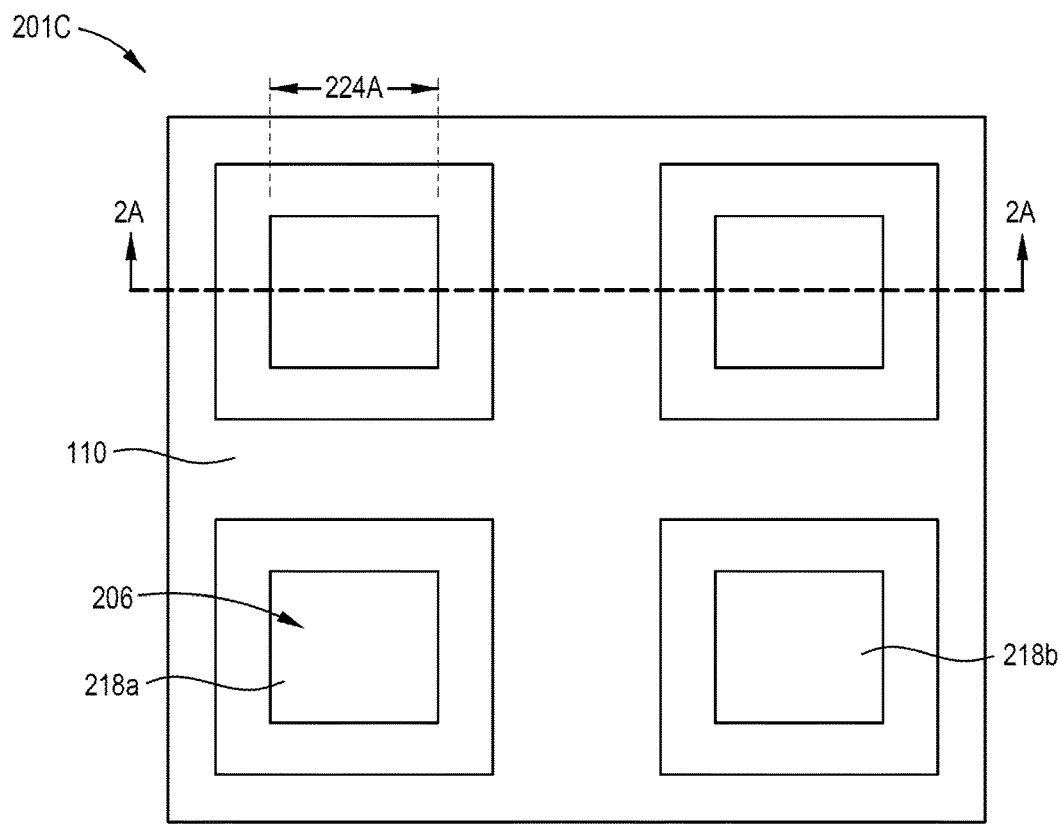
FIG. 2C is a schematic, top sectional view of a second sub-pixel circuit having a dot-type architecture according to embodiments described herein.
Figure 2D:
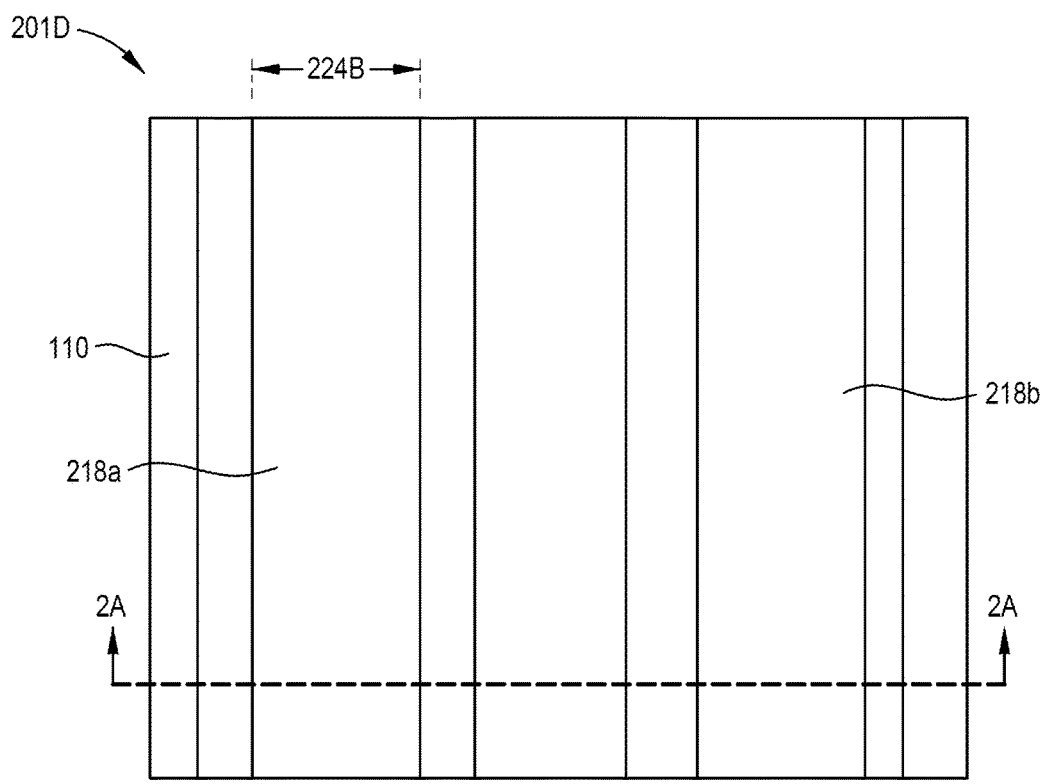
FIG. 2D is a schematic, top sectional view of a second sub-pixel circuit having a line-type architecture according to embodiments described herein.

The second sub-pixel circuit 200 has a dot-type architecture 201C (as shown in FIG. 2C) or a line-type architecture 201D (as shown in FIG. 2D). The second sub-pixel circuit 200 includes a plurality of sub-pixels 218 including at least a first sub-pixel 218a, a second sub-pixel 218b, and a third sub-pixel 218c (not shown). Each sub-pixel 218 has an OLED material 206 configured to emit a white, red, green, blue or other color light when energized. For example, the OLED material 206 of the first sub-pixel 218a may emit a red light, the OLED material of the second sub-pixel 218b may emit a green light, and the OLED material of the third sub-pixel 218c may emit a blue when energized. Adjacent non-conductive PDL structures 210 define each sub-pixel 218. The second sub-pixel circuit 200 has a density of at least 2,000 pixels-per-inch (ppi). The plurality of sub-pixels 218 are spaced from each other by a pitch 222. In some embodiments, the non-conductive PDL structures 210 having a width 224 that is substantially the same. The width 224 of the adjacent non-conductive PDL structures is about 2 to about 6 microns and the pitch 222 between each sub-pixel 218 is less than 13 microns.

The second sub-pixel circuit 200 includes a substrate 202. Anodes 204 are disposed on a top surface 203 of the substrate 202. In one embodiment, which can be combined other embodiments described herein, the anodes 204 are pre-patterned on the substrate 202. For example, the substrate 202 is a pre-patterned indium tin oxide (ITO) glass substrate. The anodes 204 include, but are not limited to, chromium, titanium, gold, silver, copper, aluminum, ITO, a combination thereof, or other suitably conductive materials.

Non-conductive PDL structures 210 are disposed on the substrate 202 and peripheral portions 205 of the anodes 204. The non-conductive PDL structures 210 include a non-conductive material. The non-conductive material of the non-conductive PDL structures 210 includes one of an organic material or an inorganic material. The organic material of the non-conductive PDL structures 210 includes, but is not limited to, polyimides. The inorganic material of the non-conductive PDL structures 210, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent non-conductive PDL structures 210 define a respective sub-pixel 218 and expose the anode 204 of the respective sub-pixel 218 of the second sub-pixel circuit 200. Each non-conductive PDL structure 210 on the second sub-pixel circuit 200 has a trench 210B disposed between peripheral portions 210A of an upper surface of each non-conductive PDL structure 210. The trench 210B of each non-conductive PDL structure 210 is formed by an isotropic dry etch process.

FIG. 2B is a schematic, cross-sectional view of a metal overhang of a second sub-pixel circuit 200. Metal layers 220 are disposed on the adjacent non-conductive PDL structures 210 of each sub-pixel 218. The metal material of the metal layers 220 include, but are not limited to, molybdenum, chromium, titanium, gold, silver, copper, aluminum, ITO, a combination thereof, or other suitably conductive materials. Metal overhangs 212 are defined by an overhang extension 215 of a metal layer 220 disposed on the peripheral portions 210A of the upper surface of non-conductive PDL structures 210. The overhang extension 215 of each metal overhang 212 extends laterally past the peripheral portions 210A of the upper surface of a non-conductive PDL structure 210 and hangs over the trench 210B area of a non-conductive PDL structure 210. The width 219 of the overhang extension 215 is about 0.5 μm to about 1.5 μm. In one example, the overhang extension 215 of the metal layer 220 is formed by a dry etch process and the metal layers 220 are further formed by a wet etch process. The second sub-pixel 218 utilizes the trench 210B disposed in the non-conductive PDL structures 210 and the overhang extension 215 extending over the trench 210B to define the overhang. Since the trench 210B is disposed in the non-conductive PDL structures 210, additional layers disposed on the inorganic PDL structures 310 are not required. Reducing the need for additional layers to define the overhang reduces process costs and design parameters to define the overhang results in increased throughput.

Inorganic layers 213 are disposed on the adjacent non-conductive PDL structures 210 and an upper surface 211 of the metal layers 220 of each sub-pixel 218. In one embodiment, the inorganic layers 213 are disposed on portions of an anode 204, the adjacent non-conductive PDL structures 210, and the upper surface 211 of the metal layers 220. The inorganic layers 213 of a sub-pixel 218 are permanent to the sub-pixel circuit and further define each sub-pixel 218 of the second sub-pixel circuit 200. The inorganic layers 213 includes an inorganic material. The inorganic material includes, but is not limited to, an inorganic silicon-containing material. For example, the silicon-containing material includes oxides or nitrides of silicon, or combinations thereof, such as silicon oxide ($SiO_2$), silicon nitride ($Si_3N_4$), or silicon oxynitride ($Si_2N_2O$).

An OLED material 206 is disposed on the anode 204 and the inorganic layers 213 of each sub-pixel 218. In some embodiments, the OLED material 206 is disposed on the anode 204 and the inorganic layers 213 of each sub-pixel 218 using a directional evaporation deposition process. The directional evaporation deposition process deposits the OLED material 206 on the anode 204 and the inorganic layers 213 until a target thickness has been achieved. A layer of the OLED material 206 is deposited on exterior sidewalls 226 of the inorganic layers 213 of each sub-pixel 218 and the metal layer 220 during the directional evaporation deposition process. The layer of the OLED material 206 is removed, e.g., using a laser etching process. The cathode 208 is disposed on the OLED material 206 that is disposed over the anode 204, the inorganic layer 213 disposed on sidewalls 217 of the non-conductive PDL structures 210 and over the metal layer 220 disposed on the peripheral portions 210A, and the overhang extension 215 of the metal layer 220. The cathode extends to contact exterior sidewalls 226 of the OLED material 206, the inorganic layer 213, and the overhang extension 215 of the metal layer 220. In some embodiments, the cathode 208 is disposed on the OLED material 206 and along exterior sidewalls 226 of the OLED material 206, the inorganic layer 213, and the overhang extensions 215 of the metal layer 220 using a directional evaporation deposition process. The metal layers 220 of each sub-pixel 218 are supplied an electrical current and/or voltage. The contact between the cathode 208 and the metal layers 220 creates a conductive path for electrical current to flow from the metal layers 220 to each sub-pixel 118.

Each sub-pixel 218 includes an encapsulation layer 214. The encapsulation layer 214 may be or may correspond to a local passivation layer. The encapsulation layer 214 of a respective sub-pixel 218 is disposed over the cathode 208. The encapsulation layer 214 is in contact with the exterior sidewalls 226 of the cathode 208, the OLED material 206, and the inorganic layer 213. The encapsulation layer 214 extends under at least a portion of each underside surface 228 of the overhang extension 215. In some embodiments, which can be combined with other embodiments described herein, the encapsulation layer 214 is disposed over the top surface 230 of the non-conductive PDL structures 210. In some embodiments, which can be combined with other embodiments described herein, there exists a gap 232 between the encapsulation layer 214 disposed on one metal overhang 212 and the encapsulation layer 214 disposed on the adjacent metal overhang 212. The encapsulation layer 214 includes an inorganic material, such as a silicon-containing material. The silicon-containing material may include $Si_3N_4$ containing materials. In some embodiments, which can be combined with other embodiments described herein, each sub-pixel 218 includes a global encapsulation layer 216. The global encapsulation layer 216 is disposed over the encapsulation layer 214. An inkjet layer may be disposed between the global encapsulation layer 216 and the encapsulation layer 214. The inkjet layer may include an acrylic material. In some embodiments, which can be combined with other embodiments described herein, the encapsulation layer 214 and the global encapsulation layer 216 are deposited using isotropic deposition processes. The isotropic deposition process deposits the encapsulation layer 214 such that the encapsulation layer 214 makes contact with the underside surface 228 of the overhang extension 215 and the top surface of 230 of the non-conductive PDL structures 210. The isotropic deposition process deposits the global encapsulation layer 216 to be disposed over at least the encapsulation layer 214 in the trench 210B.

FIG. 2C is a schematic, top sectional view of a second sub-pixel circuit 200 having a dot-type architecture 201C. The dot-type architecture 201C may correspond to the second sub-pixel circuit 200, the third sub-pixel circuit 300, or the fourth sub-pixel circuit 400. FIG. 2D is a schematic, top sectional view of a second sub-pixel circuit 200 having a line-type architecture 201D. The line-type architecture 201D may correspond to the first sub-pixel circuit 100, the second sub-pixel circuit 200, the third sub-pixel circuit 300, or the fourth sub-pixel circuit 400. Each of the top sectional views of FIGS. 1C and 1D are taken along section line 2' of FIG. 2A.

The dot-type architecture 201C includes a plurality of pixel openings 223A. Each of pixel openings 223A are surrounded by the non-conductive PDL structures 210 that define each of the sub-pixels 218 of the dot-type architecture 201C. The line-type architecture 201D includes a plurality of pixel openings 223B. Each of pixel openings 223B are abutted by non-conductive PDL structures 210 that define each of the sub-pixels 218 of the line-type architecture 201D.

Figure 3A:
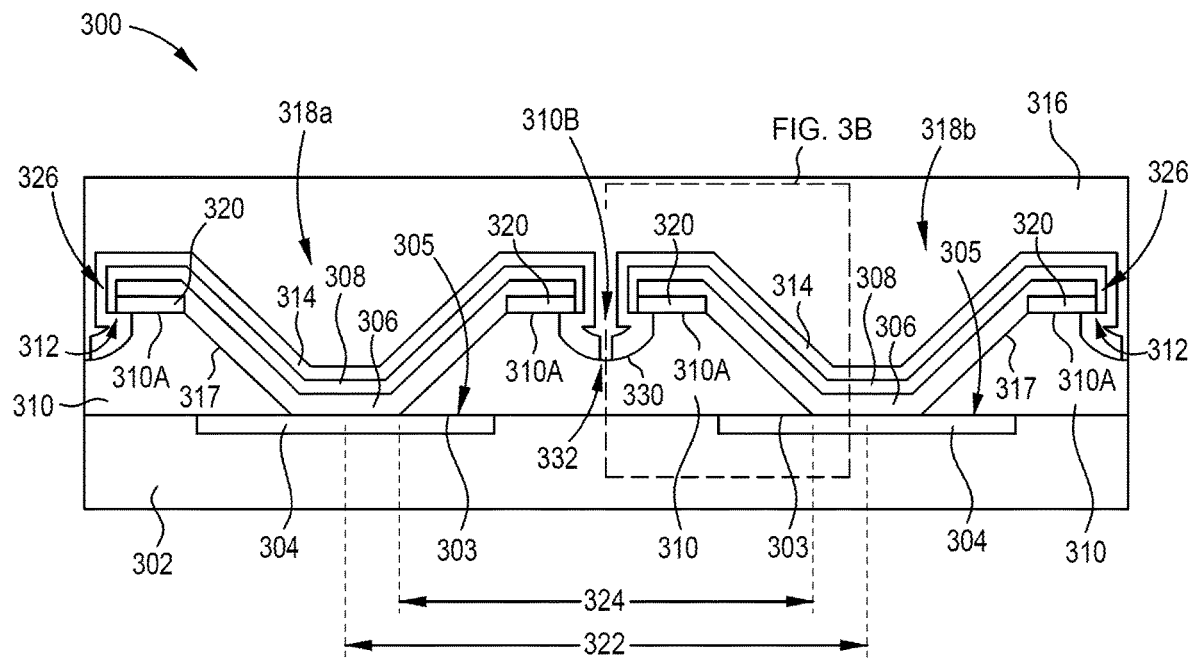
FIG. 3A is a schematic, cross-sectional view of a third sub-pixel circuit according to embodiments described herein.

FIG. 3A is a schematic, cross-sectional view of a third sub-pixel circuit 300. While FIG. 3A depicts the first sub-pixel 318a and the second sub-pixel 318b, the third sub-pixel circuit 300 of the embodiments described herein may include two or more sub-pixels 318, such as a third and a fourth sub-pixel.

The third sub-pixel circuit 300 has a dot-type architecture 201C (as shown in FIG. 2C) or a line-type architecture 201D (as shown in FIG. 2D). The third sub-pixel circuit 300 includes a plurality of sub-pixels 318 including at least a first sub-pixel 318a, a second sub-pixel 318b, and a third sub-pixel 318c (not shown). Each sub-pixel 318 has an OLED material 306 configured to emit a white, red, green, blue or other color light when energized. For example, the OLED material 306 of the first sub-pixel 318a may emit a red light, the OLED material of the second sub-pixel 318b may emit a green light, and the OLED material of the third sub-pixel 318c may emit a blue when energized. Adjacent inorganic PDL structures 310 define each sub-pixel 318. The third sub-pixel circuit 300 has a density of at least 2,000 pixels-per-inch (ppi). The plurality of sub-pixels 318 are spaced from each other by a pitch 322. In some embodiments, the inorganic PDL structures 310 having a width 324 that is substantially the same. The width 324 of the adjacent inorganic PDL structures 310 is about 2 to about 6 microns and the pitch 322 between each sub-pixel 318 is less than 13 microns.

The third sub-pixel circuit 300 includes a substrate 302. Anodes 304 are disposed on a top surface 303 of the substrate 302. In one embodiment, which can be combined other embodiments described herein, the anodes 304 are pre-patterned on the substrate 302. For example, the substrate 302 is a pre-patterned indium tin oxide (ITO) glass substrate. The anodes 304 include, but are not limited to, chromium, titanium, gold, silver, copper, aluminum, ITO, a combination thereof, or other suitably conductive materials.

Inorganic PDL structures 310 are disposed on the substrate 302 and peripheral portions 305 of the anodes 304. The inorganic PDL structures 310 include an inorganic material. The inorganic material of the inorganic PDL structures 310 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent inorganic PDL structures 310 define a respective sub-pixel 318 and expose the anode 304 of the respective sub-pixel 318 of the third sub-pixel circuit 300. Each inorganic PDL structure 310 on the sub-pixel circuit 310 has a trench 310B disposed between peripheral portions 310A of an upper surface of each inorganic PDL structure 310. The trench 310B of each inorganic PDL structure 310 is formed by an isotropic dry etch process.

Figure 3B:
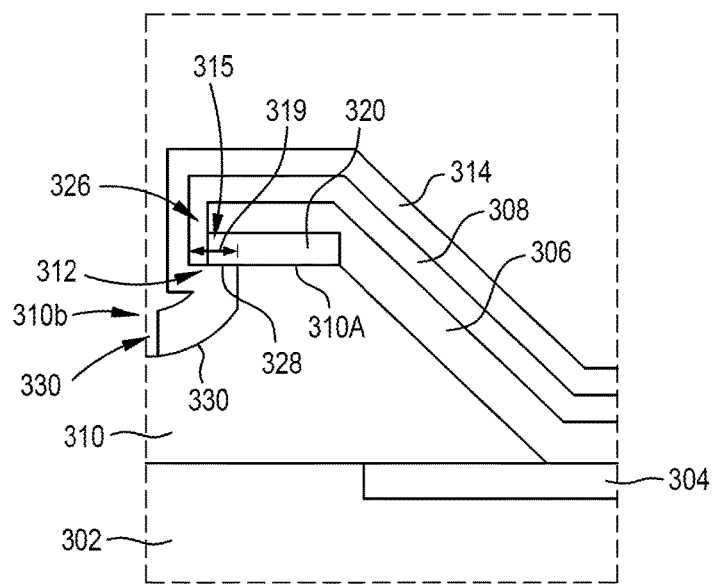
FIG. 3B is a schematic, cross-sectional view of a metal overhang of a third sub-pixel circuit according to embodiments described herein.

FIG. 3B is a schematic, cross-sectional view of a metal overhang of a third sub-pixel circuit 300. Metal layers 320 are disposed on the adjacent inorganic PDL structures 310 of each sub-pixel 318. The metal material of the metal layers 320 include, but is not limited to, molybdenum, chromium, titanium, gold, silver, copper, aluminum, ITO, a combination thereof, or other suitably conductive materials. Metal overhangs 312 are defined by an overhang extension 315 of a metal layer 320 disposed on the peripheral portions 310A of the upper surface of inorganic PDL structures 310. The overhang extension 315 of each metal overhang 312 extends laterally past the peripheral portions 310A of the upper surface of an inorganic PDL structure 310 and hangs over the trench 310B area of an inorganic PDL structure 310. The width 319 of the overhang extension 315 is about 0.5 μm to about 1.5 μm. In one example, the overhang extension 315 of the metal layer 320 is formed by a dry etch process and the metal layers 320 are further formed by a wet etch process. The third sub-pixel 318 utilizes the trench 310B disposed in the inorganic PDL structures 310 and the overhang extension 315 extending over the trench 210B to define the overhang. Since the trench 310B is disposed in the inorganic PDL structures 310, additional layers disposed on the inorganic PDL structures 310 are not required. Reducing the need for additional layers to define the overhang reduces process costs and design parameters to define the overhang results in increased throughput.

An OLED material 306 is disposed on the anode 304 and the inorganic PDL structures 310 of each sub-pixel 318. In some embodiments, the OLED material 306 is disposed on the anode 304 and the inorganic PDL structures 310 of each sub-pixel 318 using a directional evaporation deposition process. The directional evaporation deposition process deposits the OLED material 306 on the anode 304 and the inorganic PDL structures 310 until a target thickness has been achieved. A layer of the OLED material 306 is deposited on exterior sidewalls 326 of the metal layer 320 during the directional evaporation deposition process. The layer of the OLED material 306 is removed, e.g., using a laser etching process. The cathode 308 is disposed on the OLED material 306 that is disposed over the anode 304, sidewalls 317 of the inorganic PDL structures 310, the metal layer 320 disposed on the peripheral portions 310A, and the overhang extension 315 of the metal layer 320. The cathode extends to contact exterior sidewalls 226 of the OLED material 206, the inorganic layer 213, and the overhang extension 215 of the metal layer 220. The cathode 308 of each sub-pixel 318 extends to contact exterior sidewalls 326 of the OLED material 306, and the overhang extension 315 of the metal layers 320. In some embodiments, the cathode 308 is disposed on the OLED material 306 and along exterior sidewalls 326 of the OLED material 306 and the overhang extensions 315 of the metal layer 320 using a directional evaporation deposition process. The metal layers 320 of each sub-pixel 318 are supplied an electrical current and/or voltage. The contact between the cathode 308 and the metal layers 320 creates a conductive path for electrical current to flow from the metal layers 320 to each sub-pixel 318.

Each sub-pixel 318 includes an encapsulation layer 314. The encapsulation layer 314 may be or may correspond to a local passivation layer. The encapsulation layer 314 of a respective sub-pixel 318 is disposed over the cathode 308. The encapsulation layer 314 is in contact with the exterior sidewalls 326 of the cathode 308, the OLED material 306, and the metal layers 320. The encapsulation layer 314 extends under at least a portion of each underside surface 328 of the overhang extension 315. In some embodiments, which can be combined with other embodiments described herein, the encapsulation layer 314 is disposed over the top surface 330 of the inorganic PDL structures 310. In some embodiments, which can be combined with other embodiments described herein, there exists a gap 332 between the encapsulation layer 314 disposed on one metal overhang 312 and the encapsulation layer 314 disposed on the adjacent metal overhang 312. The encapsulation layer 314 includes an inorganic material, such as a silicon-containing material. The silicon-containing material may include $Si_3N_4$ containing materials. In some embodiments, which can be combined with other embodiments described herein, each sub-pixel 318 includes a global encapsulation layer 316. The global encapsulation layer 316 is disposed over the encapsulation layer 314. An inkjet layer may be disposed between the global encapsulation layer 316 and the encapsulation layer 314. The inkjet layer may include an acrylic material. In some embodiments, which can be combined with other embodiments described herein, the encapsulation layer 314 and the global encapsulation layer 316 are deposited using isotropic deposition processes. The isotropic deposition process deposits the encapsulation layer 314 such that the encapsulation layer 314 makes contact with the underside surface 328 of the overhang extension 315 and the top surface of 330 of the inorganic PDL structures 310. The isotropic deposition process deposits the global encapsulation layer 316 to be disposed over at least the encapsulation layer 314 in the trench 310B.

Figure 4A:
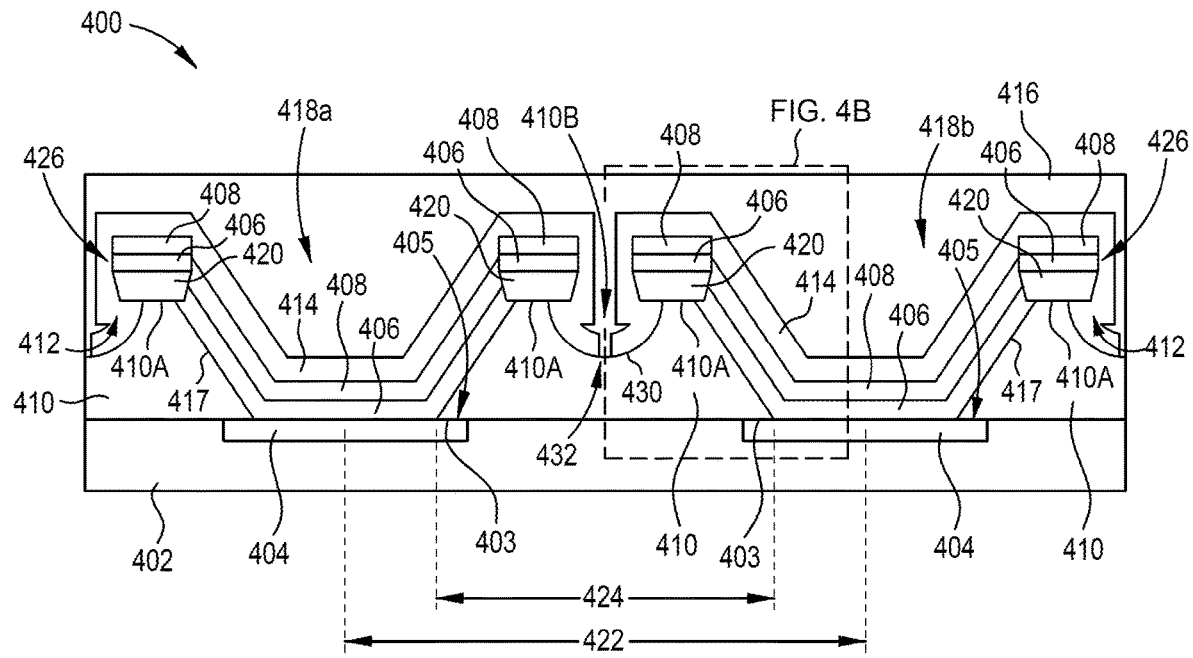
FIG. 4A is a schematic, cross-sectional view of a fourth sub-pixel circuit according to embodiments described herein.

FIG. 4A is a schematic, cross-sectional view of a fourth sub-pixel circuit 400. While FIG. 4A depicts the first sub-pixel 418a and the second sub-pixel 418b, the fourth sub-pixel circuit 400 of the embodiments described herein may include two or more sub-pixels 418, such as a third and a fourth sub-pixel.

The fourth sub-pixel circuit 400 has a dot-type architecture 201C (as shown in FIG. 2C) or a line-type architecture 201D (as shown in FIG. 2D). The fourth sub-pixel circuit 400 includes a plurality of sub-pixels 418 including at least a first sub-pixel 418a, a second sub-pixel 418b, and a third sub-pixel 418c (not shown). Each sub-pixel 418 has an OLED material 406 configured to emit a white, red, green, blue or other color light when energized. For example, the OLED material 406 of the first sub-pixel 418a may emit a red light, the OLED material of the second sub-pixel 418b may emit a green light, and the OLED material of the third sub-pixel 418c may emit a blue when energized. Adjacent inorganic PDL structures 410 define each sub-pixel 418. The fourth sub-pixel circuit 400 has a density of at least 2,000 pixels-per-inch (ppi). The plurality of sub-pixels 418 are spaced from each other by a pitch 422. In some embodiments, the inorganic PDL structures 410 having a width 424 that is substantially the same. The width 424 of the adjacent inorganic PDL structures 410 is about 2 to about 6 microns and the pitch 422 between each sub-pixel 418 is less than 13 microns.

The fourth sub-pixel circuit 400 includes a substrate 402. Anodes 404 are disposed on a top surface 403 of the substrate 402. In one embodiment, which can be combined other embodiments described herein, the anodes 404 are pre-patterned on the substrate 402. For example, the substrate 402 is a pre-patterned indium tin oxide (ITO) glass substrate. The anodes 404 include, but are not limited to, chromium, titanium, gold, silver, copper, aluminum, ITO, a combination thereof, or other suitably conductive materials.

Inorganic PDL structures 410 are disposed on the substrate 402 and peripheral portions 405 of the anodes 404. The inorganic PDL structures 410 include an inorganic material. The inorganic material of the inorganic PDL structures 410 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent inorganic PDL structures 410 define a respective sub-pixel 418 and expose the anode 404 of the respective sub-pixel 418 of the fourth sub-pixel circuit 400. Each inorganic PDL structure 410 on the sub-pixel circuit 410 has a trench 410B disposed between peripheral portions 410A of an upper surface of each inorganic PDL structure 410. The trench 410B of each inorganic PDL structure 410 is formed by an isotropic dry etch process.

Figure 4B:
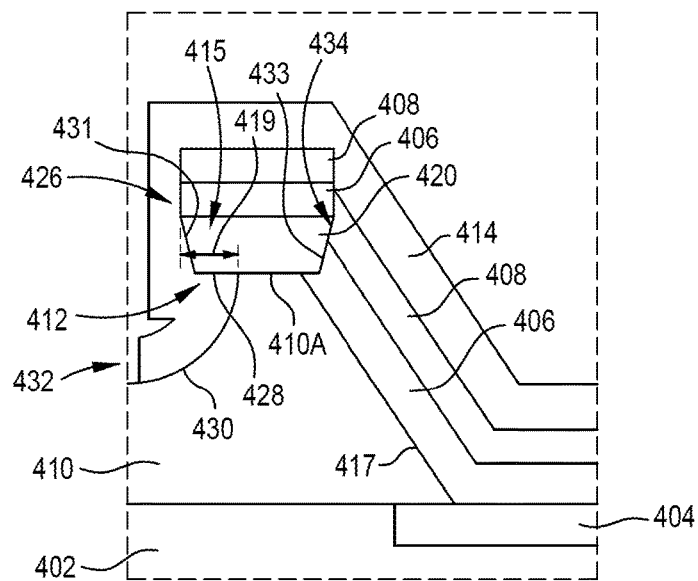
FIG. 4B is a schematic, cross-sectional view of a metal overhang of a fourth sub-pixel circuit according to embodiments described herein.

FIG. 4B is a schematic, cross-sectional view of a metal overhang 412 of the fourth sub-pixel circuit 400. Metal layers 420 are disposed on the adjacent inorganic PDL structures 410 of each sub-pixel 418. The metal material of the metal layers 420 include, but are not limited to, molybdenum, chromium, titanium, gold, silver, copper, aluminum, ITO, a combination thereof, or other suitably conductive materials. Metal overhangs 412 are defined by an overhang extension 415 of a metal layer 420 disposed on the peripheral portions 410A of the upper surface of inorganic PDL structures 410. The metal extension 415 has a first tapered sidewall 431 and the interior portion 434 of the metal layer 420 has a second tapered sidewall 433. The overhang extension 415 of each metal overhang 412 extends laterally past the peripheral portions 410A of the upper surface of an inorganic PDL structure 410 and hangs over the trench 410B area of an inorganic PDL structure 410. The width 419 of the overhang extension 415 is about 0.5 µm to about 1.5 µm. In one example, the overhang extension 415 of the metal layer 420 is formed by a dry etch process and the metal layers 420 are further formed by a wet etch process. The fourth sub-pixel 418 utilizes the trench 410B disposed in the inorganic PDL structures 410 and the overhang extension 415 extending over the trench 410B to define the overhang. Since the trench 410B is disposed in the inorganic PDL structures 410, additional layers disposed on the inorganic PDL structures 410 are not required. Reducing the need for additional layers to define the overhang reduces process costs and design parameters to define the overhang results in increased throughput.

An OLED material 406 is disposed on the anode 404 and the inorganic PDL structures 410 of each sub-pixel 418. In some embodiments, the OLED material 406 is disposed on the anode 404 and the inorganic PDL structures 410 of each sub-pixel 418 using a directional evaporation deposition process. The directional evaporation deposition process deposits the OLED material 406 on the anode 404 and the inorganic PDL structures 410 until a target thickness has been achieved. A layer of the OLED material 406 is deposited on exterior sidewalls 426 of the metal layer 420 during the directional evaporation deposition process. The layer of the OLED material 406 is removed, e.g., using a laser etching process. The OLED material 406 deposited on top of the metal layer 420 is disconnected from the OLED material 406 deposited on the anode 404 and along sidewalls 417 of the inorganic PDL structures 410. The cathode 408 is disposed on the OLED material 406 that is disposed over the anode 404, sidewalls 417 of the inorganic PDL structures 410, the metal layer 420 disposed on the peripheral portions 410A, and the overhang extension 415 of the metal layer 420. The cathode 408 contacts the second tapered sidewall 433 of the interior portion 434 of the metal layer 420. In some embodiments, the cathode 408 is disposed on the OLED material 406 and along exterior sidewalls 426 of the OLED material 406 and the overhang extensions 415 of the metal layer 420 using a directional evaporation deposition process. The metal layers 420 of each sub-pixel 418 are supplied an electrical current and/or voltage. The contact between the cathode 408 and the metal layers 420 creates a conductive path for electrical current to flow from the metal layers 420 to each sub-pixel 418.

Each sub-pixel 418 includes an encapsulation layer 414. The encapsulation layer 414 may be or may correspond to a local passivation layer. The encapsulation layer 414 of a respective sub-pixel 418 is disposed over the cathode 408. The encapsulation layer 414 is in contact with the exterior sidewalls 426 of the cathode 408, the OLED material 406, and the metal layers 420. The encapsulation layer 414 extends under at least a portion of each underside surface 428 of the overhang extension 415. In some embodiments, which can be combined with other embodiments described herein, the encapsulation layer 414 is disposed over the top surface 430 of the inorganic PDL structures 410. In some embodiments, which can be combined with other embodiments described herein, there exists a gap 432 between the encapsulation layer 414 disposed on one metal overhang 412 and the encapsulation layer 414 disposed on the adjacent metal overhang 412. The encapsulation layer 414 includes an inorganic material, such as a silicon-containing material. The silicon-containing material may include $Si_3N_4$ containing materials. In some embodiments, which can be combined with other embodiments described herein, each sub-pixel 418 includes a global encapsulation layer 416. The global encapsulation layer 416 is disposed over the encapsulation layer 414. An inkjet layer may be disposed between the global encapsulation layer 416 and the encapsulation layer 414. The inkjet layer may include an acrylic material. In some embodiments, which can be combined with other embodiments described herein, the encapsulation layer 414 and the global encapsulation layer 416 are deposited using isotropic deposition processes. The isotropic deposition process deposits the encapsulation layer 414 such that the encapsulation layer 414 makes contact with the underside surface 428 of the overhang extension 415 and the top surface of 430 of the inorganic PDL structures 410. The isotropic deposition process deposits the global encapsulation layer 416 to be disposed over at least the encapsulation layer 414 in the trench 410B.

In summation, described herein relate to forming sub-pixel circuits that may be utilized in a display such as an organic light emitting diode (OLED) display. The adjacent inorganic PDL overhang structures (according to the first sub-pixel circuit) or metal-containing overhang structures (according to the second, third, or fourth sub-pixel circuits) defining each sub-pixel of the sub-pixel circuit of the display provide for formation of the sub-pixel circuit using evaporation deposition. Each sub-pixel utilizes the trench disposed in the PDL and the extension of the inorganic or metal overhang extending over the trench to define the overhang. As the trench is disposed in the PDL, additional layers disposed on the PDL are not required. Reducing the need for additional layers to define the overhang reduces process costs and design parameters to define the overhang results in increased throughput.

While the foregoing is directed to embodiments of the present disclosure, other and further embodiments of the disclosure may be devised without departing from the basic scope thereof, and the scope thereof is determined by the claims that follow.

What is claimed is:

1. A device having a plurality of sub-pixels, each sub-pixel comprising:
    a section of a substrate;
    first and second pixel-defining layer (PDL) structures comprising an inorganic material, each of the first and second PDL structures having a trench disposed between peripheral portions of an upper surface of each of the first and second PDL structures;
    first and second metal overhangs, each of the first and second metal overhangs defined by an overhang extension of a metal layer disposed on the peripheral portions of the upper surface of the first and second PDL structures, the overhang extension extending laterally past the trench to define the first and second metal overhangs;
    an anode;
    an organic light-emitting diode (OLED) material disposed on the anode, sidewalls of the first and second PDL structures, the metal layer disposed on the peripheral portions of the upper surface, and the overhang extension; and
    a cathode disposed on the OLED material disposed over:
        the anode;
        the sidewalls of the first and second PDL structures;
        the metal layer disposed on the peripheral portions of the upper surface of the first and second PDL structures; and
        the overhang extension of the metal layer, wherein the cathode extends to contact exterior sidewalls of the OLED material and the overhang extension of the metal layer.

2. The device of claim 1, further comprising an encapsulation layer disposed to contact:
    the cathode;
    sidewalls of the cathode, the OLED material, and the overhang extension of the metal layer;
    an underside surface of each overhang extension of the metal layer; and
    a portion of a top surface of the trench disposed between peripheral portions each of the first and second PDL structures.

3. The device of claim 1, wherein the device comprises a line-type architecture or a dot-type architecture.

4. The device of claim 1, wherein the device comprises a local cathode contact.

5. The device of claim 1, wherein the inorganic material comprises silicon nitride ($Si_3N_4$), silicon oxynitride (SiON), magnesium fluoride ($MgF_2$), silicon oxide ($SiO_2$), or combinations thereof.

6. The device of claim 1, wherein the metal layer comprises Ti, Mo, Al, Cu, TCO, or combinations thereof.

7. The device of claim 6, wherein the TCO comprises IZO, ITO, IGZO, or combinations thereof.

8. A device having a plurality of sub-pixels, each sub-pixel comprising:
    a section of a substrate;
    first and second pixel-defining layer (PDL) structures comprising an inorganic material, each of the first and second PDL structures having a trench disposed between peripheral portions of an upper surface of each of the first and second PDL structures;
    first and second metal overhangs, each of the first and second metal overhangs defined by an overhang extension of a metal layer disposed on the peripheral portions of the upper surface of the first and second PDL structures, the overhang extension extending laterally past the trench to define the first and second metal overhangs;
    an anode;
    an organic light-emitting diode (OLED) material disposed on the anode, sidewalls of the first and second PDL structures, the metal layer disposed on the peripheral portions of the upper surface, and the overhang extension; and
    a cathode disposed on the OLED material disposed over:
        the anode;
        the sidewalls of the first and second PDL structures;
        the metal layer disposed on the peripheral portions of the upper surface of the first and second PDL structures; and
        the cathode is further disposed over the overhang extension of the metal layer.

9. The device of claim 8, wherein the cathode extends to contact exterior sidewalls of the OLED material and the overhang extension of the metal layer.

10. The device of claim 9, further comprising an encapsulation layer disposed to contact:
    the cathode;
    sidewalls of the cathode, the OLED material, and the overhang extension of the metal layer;
    an underside surface of each overhang extension of the metal layer; and
    a portion of a top surface of the trench disposed between peripheral portions each of the first and second PDL structures.

11. The device of claim 8, wherein the device comprises a line-type architecture or a dot-type architecture.

12. The device of claim 8, wherein the device comprises a local cathode contact.

13. The device of claim 8, wherein the inorganic material comprises silicon nitride ($Si_3N_4$), silicon oxynitride (SiON), magnesium fluoride ($MgF_2$), silicon oxide ($SiO_2$), or combinations thereof.

14. The device of claim 8, wherein the metal layer comprises Ti, Mo, Al, Cu, TCO, or combinations thereof.

15. The device of claim 14, wherein the TCO comprises IZO, ITO, IGZO, or combinations thereof.

16. A device having a plurality of sub-pixels, each sub-pixel comprising:
    a section of a substrate;

first and second pixel-defining layer (PDL) structures comprising an inorganic material, each of the first and second PDL structures having a trench disposed between peripheral portions of an upper surface of each of the first and second PDL structures;

first and second metal overhangs, each of the first and second metal overhangs defined by an overhang extension of a metal layer disposed on the peripheral portions of the upper surface of the first and second PDL structures, the overhang extension extending laterally past the trench to define the first and second metal overhangs;

an anode;

an organic light-emitting diode (OLED) material disposed on the anode, sidewalls of the first and second PDL structures, the metal layer disposed on the peripheral portions of the upper surface, and the overhang extension; and a cathode.

17. The device of claim 16, wherein the cathode is disposed on the OLED material disposed over:
the anode;
the sidewalls of the first and second PDL structures;
the metal layer disposed on the peripheral portions of the upper surface of the first and second PDL structures; and
the overhang extension of the metal layer, wherein the cathode extends to contact exterior sidewalls of the OLED material and the overhang extension of the metal layer.

18. The device of claim 17, further comprising an encapsulation layer disposed to contact:
the cathode;
sidewalls of the cathode, the OLED material, and the overhang extension of the metal layer;
an underside surface of each overhang extension of the metal layer; and
a portion of a top surface of the trench disposed between peripheral portions each of the first and second PDL structures.

19. The device of claim 16, wherein the device comprises a line-type architecture or a dot-type architecture.

20. The device of claim 16, wherein the device comprises a dot-type architecture.

21. The device of claim 16, wherein the device comprises a local cathode contact.

22. The device of claim 16, wherein the inorganic material comprises silicon nitride ($Si_3N_4$), silicon oxynitride (SiON), magnesium fluoride ($MgF_2$), silicon oxide ($SiO_2$), or combinations thereof.

23. The device of claim 16, wherein the metal layer comprises Ti, Mo, Al, Cu, TCO, or combinations thereof.

24. The device of claim 23, wherein the TCO comprises IZO, ITO, IGZO, or combinations thereof.

25. A device having a plurality of sub-pixels, each sub-pixel comprising:
a section of a substrate;
first and second pixel-defining layer (PDL) structures comprising an inorganic material, each of the first and second PDL structures having a trench disposed between peripheral portions of an upper surface of each of the first and second PDL structures;
first and second metal overhangs, each of the first and second metal overhangs defined by an overhang extension of a metal layer disposed on the peripheral portions of the upper surface of the first and second PDL structures, the overhang extension extending laterally past the trench to define the first and second metal overhangs;
an anode;
an organic light-emitting diode (OLED) material disposed on the anode, sidewalls of the first and second PDL structures, the metal layer disposed on the peripheral portions of the upper surface, and the overhang extension; and a cathode disposed on the OLED material disposed over:
the anode;
the sidewalls of the first and second PDL structures;
the metal layer disposed on the peripheral portions of the upper surface of the first and second PDL structures; and
the overhang extension of the metal layer, wherein the cathode extends to contact exterior sidewalls of the OLED material and the overhang extension of the metal layer; and
an encapsulation layer disposed to contact:
the cathode;
sidewalls of the cathode, the OLED material, and the overhang extension of the metal layer;
an underside surface of each overhang extension of the metal layer; and
a portion of a top surface of the trench disposed between peripheral portions each of the first and second PDL structures.

26. The device of claim 25, wherein the device comprises a line-type architecture or a dot-type architecture.

27. The device of claim 25, wherein the device comprises a local cathode contact.

28. The device of claim 25, wherein the inorganic material comprises silicon nitride ($Si_3N_4$), silicon oxynitride (SiON), magnesium fluoride ($MgF_2$), silicon oxide ($SiO_2$), or combinations thereof.

29. The device of claim 25, wherein the metal layer comprises Ti, Mo, Al, Cu, TCO, or combinations thereof.

30. The device of claim 29, wherein the TCO comprises IZO, ITO, IGZO, or combinations thereof.

* * * * *